(12) United States Patent
Yang et al.

(10) Patent No.: US 8,736,083 B2
(45) Date of Patent: May 27, 2014

(54) BONDING INSPECTION STRUCTURE

(75) Inventors: Sheng-Shu Yang, Hsinchu (TW); Hsiao-Ting Lee, Nantou County (TW); Chao-Chyun An, Hsinchu (TW)

(73) Assignees: Taiwan TFT LCD Association, Hsinchu (TW); Chunghwa Picture Tubes, Ltd., Taoyuan (TW); Au Optronics Corporation, Hsinchu (TW); Hannstar Display Corporation, New Taipei (TW); Chimei Innolux Corporation, Miao-Li County (TW); Industrial Technology Research Institute, Hsinchu (TW)

( * ) Notice: Subject to any disclaimer, the term of this patent is extended or adjusted under 35 U.S.C. 154(b) by 225 days.

(21) Appl. No.: 12/431,766

(22) Filed: Apr. 29, 2009

(65) Prior Publication Data
US 2010/0163869 A1    Jul. 1, 2010

(30) Foreign Application Priority Data

Dec. 31, 2008  (TW) ............................... 97151852 A

(51) Int. Cl.
*H01L 23/544* (2006.01)
(52) U.S. Cl.
USPC ...................... 257/797; 257/737; 257/E23.02

(58) Field of Classification Search
USPC ............ 257/737, 797, 614, E23.02; 438/614
See application file for complete search history.

(56) References Cited

U.S. PATENT DOCUMENTS

| 5,393,697 A | 2/1995 | Chang et al. |
| 5,707,902 A | 1/1998 | Chang et al. |
| 6,972,490 B2 | 12/2005 | Chang et al. |
| 2008/0197352 A1* | 8/2008 | Chen et al. ...................... 257/48 |

FOREIGN PATENT DOCUMENTS

| CN | 101266956 | 9/2008 |
| TW | 324847 | 1/1998 |
| TW | I246732 | 1/2006 |

OTHER PUBLICATIONS

"Office Action of Taiwan Counterpart Application", issued on Apr. 17, 2013, p. 1-p. 4, in which the listed references were cited.
"First Office Action of China Counterpart Application", issued on May 25, 2011, p. 1-p. 8, in which the listed reference was cited.

* cited by examiner

*Primary Examiner* — Matthew Reames
(74) *Attorney, Agent, or Firm* — Jianq Chyun IP Office

(57) ABSTRACT

A bonding inspection structure is provided. The bonding inspection structure includes at least a elastic bump located on a substrate. At least an opening is formed in the top portion of the elastic bump. An inspection area of the top portion of the elastic bump is larger than an area of the opening.

35 Claims, 14 Drawing Sheets

BONDING INSPECTION STRUCTURE

CROSS-REFERENCE TO RELATED APPLICATION

This application claims the priority benefit of Taiwan application serial no. 97151852, filed Dec. 31, 2008. The entirety of the above-mentioned patent application is hereby incorporated by reference herein and made a part of specification.

BACKGROUND OF THE INVENTION

1. Field of the Invention

The present invention relates to a bonding inspection structure.

2. Description of Related Art

In the process of chip-on-glass (COG) bonding, a bonding gap between glass and an IC is determined by factors, such as pressure for the fabrication, characteristics of the materials, release of stress, and so forth. A typical method for inspecting the bonding quality is to observe the compression of conductive particles of an anisotropic conductive film (ACF). When improper compression occurs, the conductive particles are not cracked, which easily fails in the conductivity of electricity. However, if the compression pressure is overly high and excessively compresses the conductive particles, non-conductivity may also occur.

To achieve high density of contacts, materials, such as elastic bumps and non-conductive films (NCF), tend to be used in the design of IC bumps. Although there are no conductive particles of the anisotropic conductive film (ACF) for observation, compressed elastic bumps have characteristics similar to compressed conductive particles and the cracking of the elastic bumps can also be used to inspect the bonding quality. The cracking of elastic bumps can only be analyzed by using a scanning electron microscope (SEM). Hence, the inspection of compression and conductivity can only be performed based on slices thereof and flexible board testing after the fabrication is completed.

The disclosures of U.S. Pat. No. 5,707,902 and U.S. Pat. No. 6,972,490 are related to bonding inspection. U.S. Pat. No. 5,707,902 is focused on improving the shape, size, and arrangement of bumps, and the inspection is based on compression traces. However, the bumps in the aforesaid patent do not allow the inspector to instantly and effectively examine the height difference of bonding gap. Hence, the damage cannot be effectively detected. U.S. Pat. No. 6,972,490 discloses elastic bumps used as stoppers. The aforesaid elastic bumps all have the same height that is lower than electrode bumps. Thus, there is no damage or cracking for immediate inspection. In addition, this patent does not mention whether the bump structures can be conducted for determining the fabrication yield.

SUMMARY OF THE INVENTION

The present invention provides a bonding inspection structure disposed on a substrate, and the bonding inspection structure includes at least an elastic bump. The elastic bump is located on the substrate. At least an opening is formed in the elastic bump, and an inspection area on the top portion of the elastic bump is larger than an area of the opening.

The present invention provides a bonding structure which includes a first substrate, a second substrate, a bonding inspection structure, and a bonding material. The bonding inspection structure, which is disposed between the first and the second substrates, includes at least an elastic bump. At least an opening is formed in the elastic bump, and an inspection area on the top portion of the elastic bump is larger than an area of the opening. The bonding material is disposed around the bonding inspection structure to seal the first and the second substrates.

To make the above features of the present invention more comprehensible, several embodiments accompanied with drawings are described in detail as follows.

BRIEF DESCRIPTION OF THE DRAWINGS

The accompanying drawings are included to provide a further understanding of the exemplary embodiment, and are incorporated in and constitute a part of this specification.

FIG. 6C-1 is a schematic top view of the column-like bonding inspection structure having an oblique plane top portion with a plurality of holes as shown in FIG. 6C.

FIG. 6C-2 is a schematic top view of another column-like bonding inspection structure having an oblique plane top portion with a plurality of holes and a plurality of notches as shown in FIG. 6C.

DESCRIPTION OF EMBODIMENTS

Figure 1A:
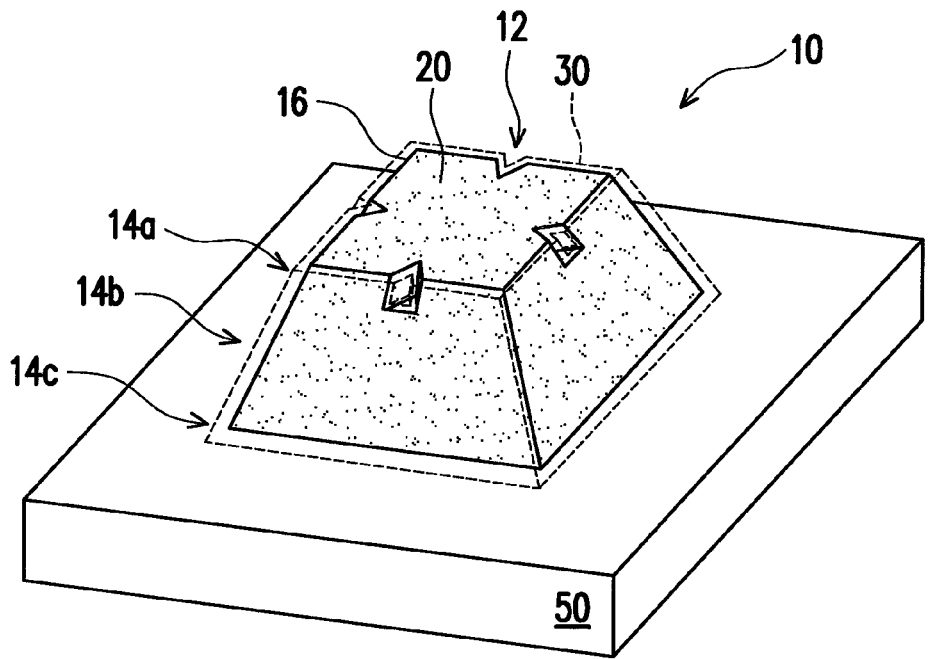
FIG. 1A is a schematic perspective view of a bonding inspection structure having notches at an edge of a top portion thereof according to an exemplary embodiment.
Figure 1B:
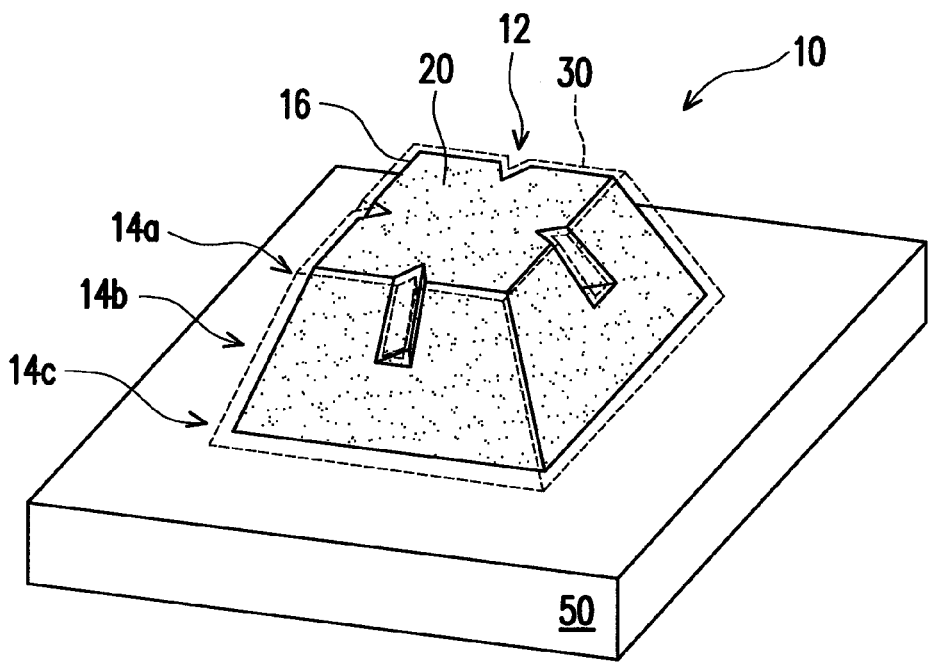
FIG. 1B is a schematic perspective view of a bonding inspection structure having notches extending from an edge of a top portion thereof to a middle portion thereof according to an exemplary embodiment.
Figure 1C:
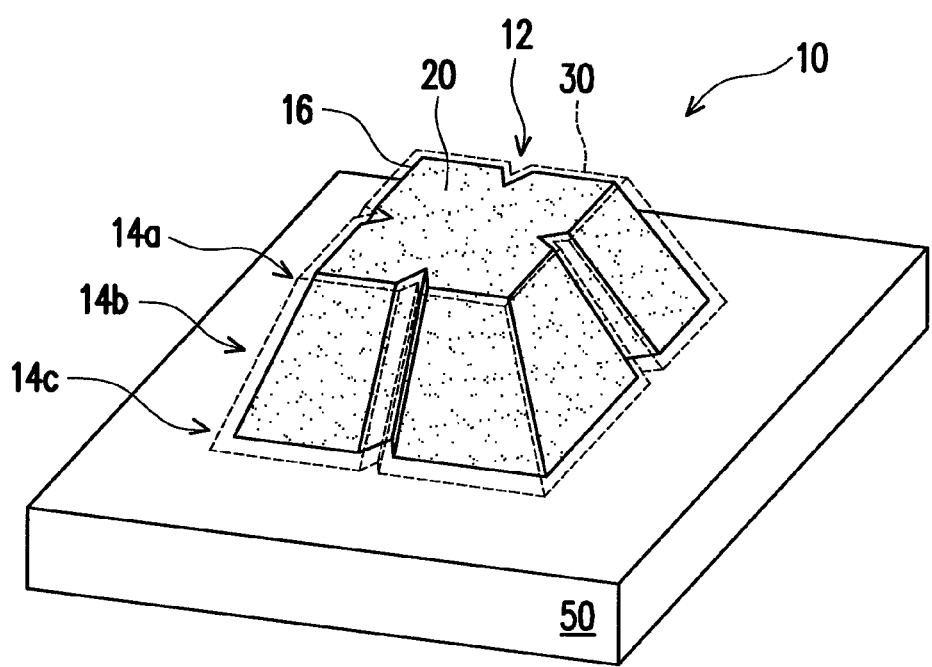
FIG. 1C is a schematic perspective view of a bonding inspection structure having notches extending from an edge of a top portion thereof to a bottom portion thereof according to an exemplary embodiment.

FIGS. 1A~1C are schematic views showing various types of a bonding inspection structure 10 according to the exemplary embodiments. Referring to FIG. 1A, an edge 16 of a top portion 14a on the bonding inspection structure 10 of this embodiment has a notch 12. In one of the embodiments, the bonding inspection structure 10 includes at least an elastic bump 20 located on a substrate 50. The substrate 50 is a rigid substrate, a soft substrate, or a flexible substrate. A material of the elastic bump 20 comprises an organic material, an inorganic material, or a composite material thereof. In another embodiment, the bonding inspection structure 10 further includes at least a conductive layer 30 in addition to the elastic bump 20. The conductive layer 30 at least covers a portion of the top portion 14a of the elastic bump 20. In the example as shown in FIG. 1A, the conductive layer 30 is conformal and covers the elastic bump 20. A material for forming the conductive layer 30 is a metal, for example. For clear illustration, the conductive layer 30 in the drawings is indicated by dotted lines.

Because the notch 12 is formed on the edge 16 of the top portion 14a on the bonding inspection structure 10, cracks would occur when the bonding inspection structure 10 is compressed by a low pressure. The present invention does not restrict the form of the notch 12, which can be a curved or a triangular shape. In addition, the present invention does not limit the number of the notch 12 formed on the edge 16 of the top portion 14a. In FIG. 1A, one notch 12 is formed on each side, for example.

Figure 1D:
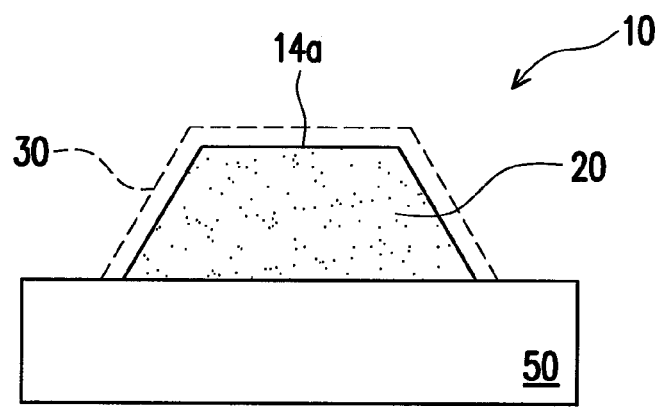
FIG. 1D is a schematic cross-sectional view of a pyramid bonding inspection structure having a horizontal plane top portion according to an exemplary embodiment.
Figure 1E:
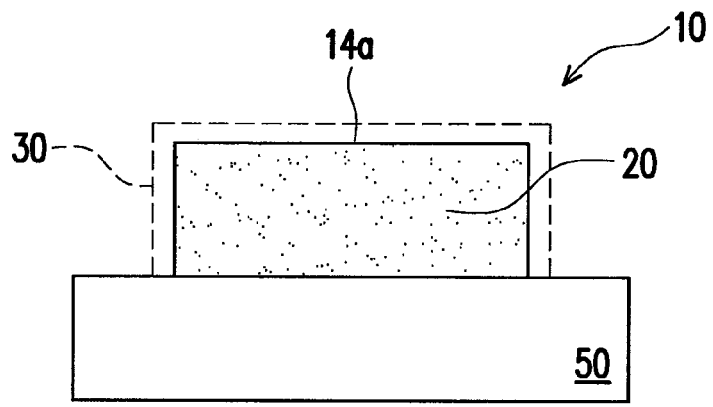
FIG. 1E is a schematic cross-sectional view of a column-like bonding inspection structure having a horizontal plane top portion according to an exemplary embodiment.
Figure 1F:
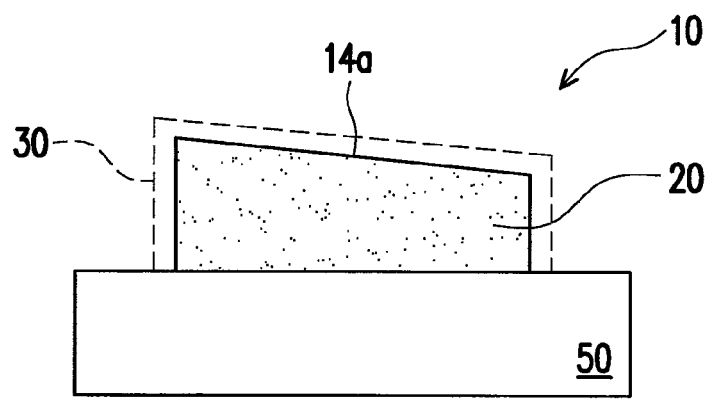
FIG. 1F is a schematic cross-sectional view of a column-like bonding inspection structure having an oblique plane top portion according to an exemplary embodiment.
Figure 1G:
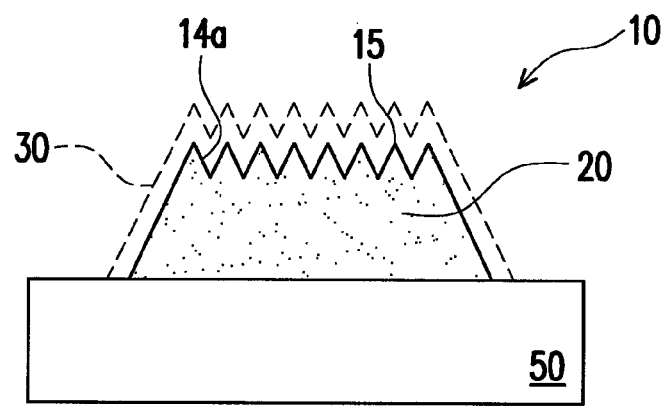
FIG. 1G is a schematic cross-sectional view of a bonding inspection structure having a top portion of sharp teeth according to an exemplary embodiment.
Figure 1H:
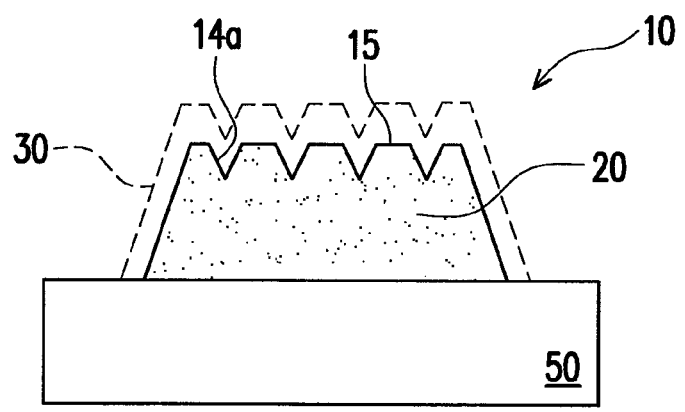
FIG. 1H is a schematic cross-sectional view of a pyramid bonding inspection structure having a top portion of another kind of sharp teeth according to an exemplary embodiment.

Moreover, except for being formed at the edge 16, the notch 12 may also extend to other positions on the lateral side of the bonding inspection structure 10, such as a middle portion 14b or a bottom portion 14c, as illustrated in FIGS. 1B and 1C. The bonding inspection structure 10 may be shaped like a cone, a pyramid or a column, as shown in FIGS. 1D and 1E respectively. A projection of the top portion 14a of the bonding inspection structure 10 on the substrate 50 can be triangular, quadrilateral, polygonal, circular, or elliptic. Furthermore, in one embodiment, the top portion 14a of the bonding inspection structure 10 is a plane, such as a horizontal plane in FIGS. 1D and 1E or an oblique plane in FIG. 1F. In another embodiment, the top portion 14a of the bonding inspection structure 10 has a surface of sharp teeth, as shown in FIGS. 1G and 1H. Take FIG. 1A as an example, the pyramid-like bonding inspection structure 10 has a quadrilateral plane top portion 14a.

Figure 2A:
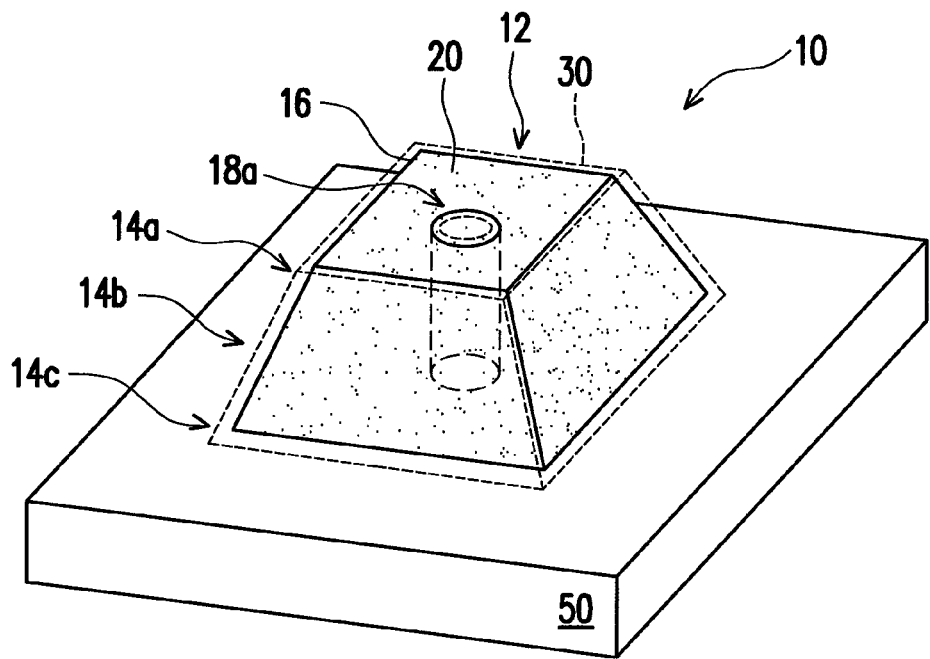
FIG. 2A is a schematic view of a bonding inspection structure having a through hole according to another exemplary embodiment.
Figure 2B:
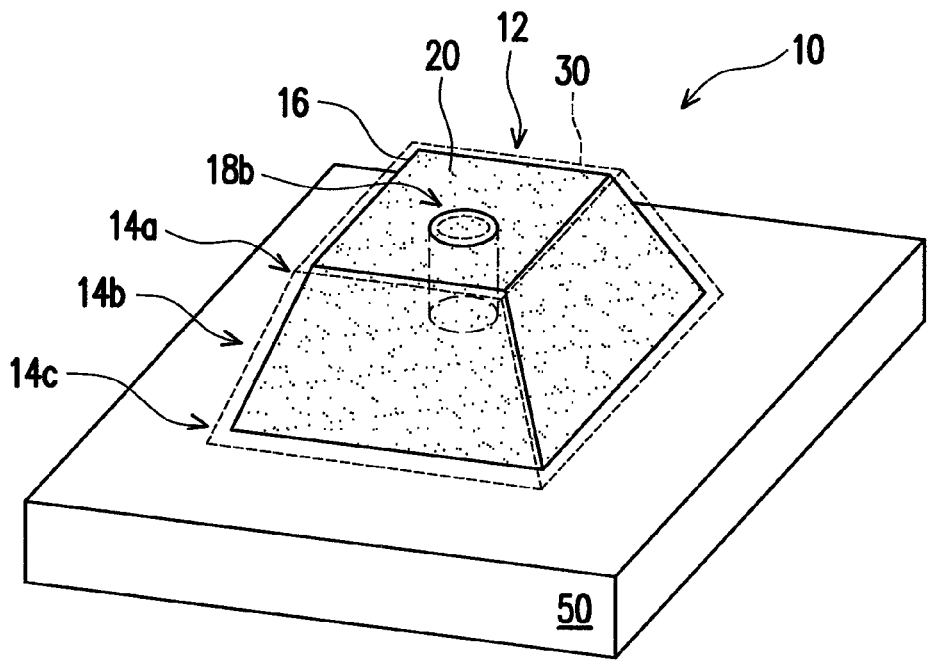
FIG. 2B is a schematic view of a bonding inspection structure having a blind hole according to another exemplary embodiment.

FIG. 2A is a schematic view of a bonding inspection structure having a through hole according to another exemplary embodiment. FIG. 2B is a schematic view of a bonding inspection structure having a blind hole according to another exemplary embodiment.

With reference to FIGS. 2A and 2B, the bonding inspection structure 10 in this embodiment has at least a through hole 18a or blind hole 18b in the center of the top portion 14a. The aforesaid center does not need to be the exact center of the top portion 14a and may be any area other than the edge. The through hole 18a is a hole passing through the bonding inspection structure 10 from the top portion 14a to the bottom portion 14c; and the blind hole 18b is a hole which may be positioned only in the top portion 14a or extend from the top portion 14a downwards to the middle portion 14b or any other depths without reaching the bottom portion 14c. The present invention does not specifically restrict the shapes of the holes 18a and 18b in the top portion 14a, and the holes 18a and 18b may be triangular, quadrilateral, polygonal, circular, or elliptic. In FIGS. 2A and 2B, circular holes are illustrated as examples.

Figure 2C:
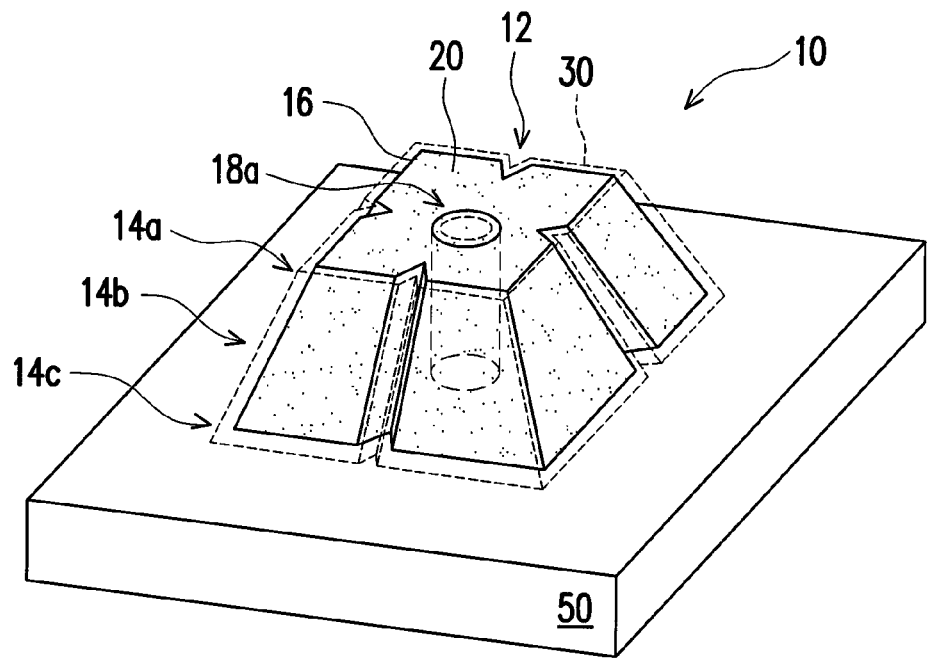
FIG. 2C is a schematic view of a bonding inspection structure having notches and a through hole according to another exemplary embodiment.
Figure 2D:
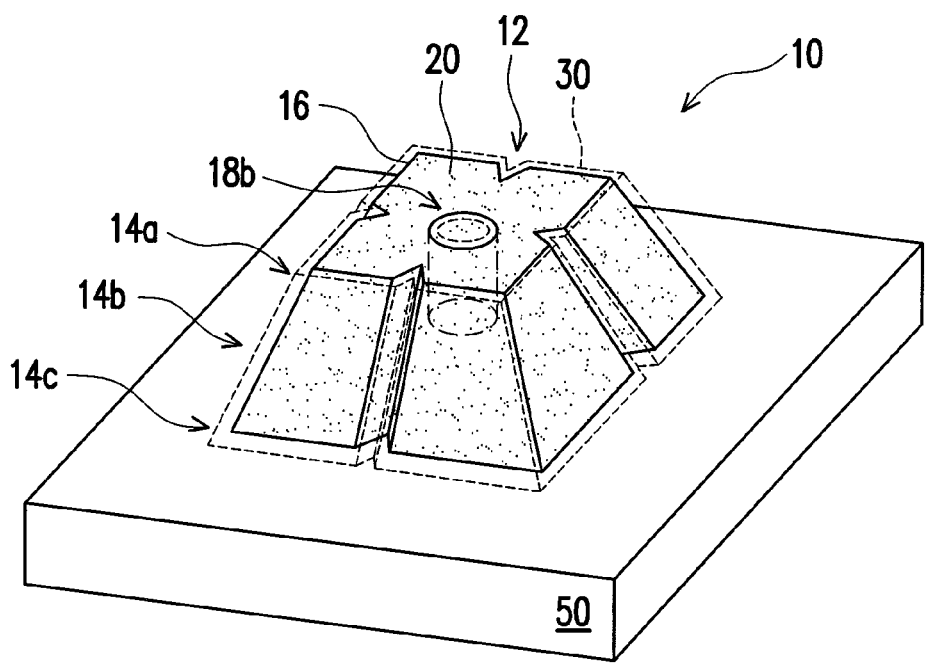
FIG. 2D is a schematic view of a bonding inspection structure having notches and a blind hole according to another exemplary embodiment.

Referring to FIGS. 2C and 2D, in order to increase the number of cracks for easy observation, the bonding inspection structure 10 in this embodiment further comprises at least one through hole 18a or blind hole 18b located in the middle of the top portion 14a, besides the notch 12 at the edge 16.

A method for fabricating the bonding inspection structures in FIGS. 1A~1C and 2A~2B is, for example, to apply a polymer layer onto the substrate to form the elastic bump later. Then, a photolithography process is used to pattern the polymer layer, so as to form elastic bumps in certain positions (such as an end of an electrode) of the electrode or outside the electrode (or called bonding pad) in an integrated circuit. Thereafter, metal is disposed on the whole substrate, and lithography and etching processes are used to form metal patterns covering the elastic bump.

The methods for forming the bonding inspection structures in FIGS. 2C and 2D are similar to the methods described in the embodiments of FIG. 1A, 1B, or 1C, but further comprise forming the through hole or blind hole in the polymer layer to form the elastic bump when patterning the polymer layer. Then, the aforesaid steps are performed to form a patterned metal layer.

Figure 3:
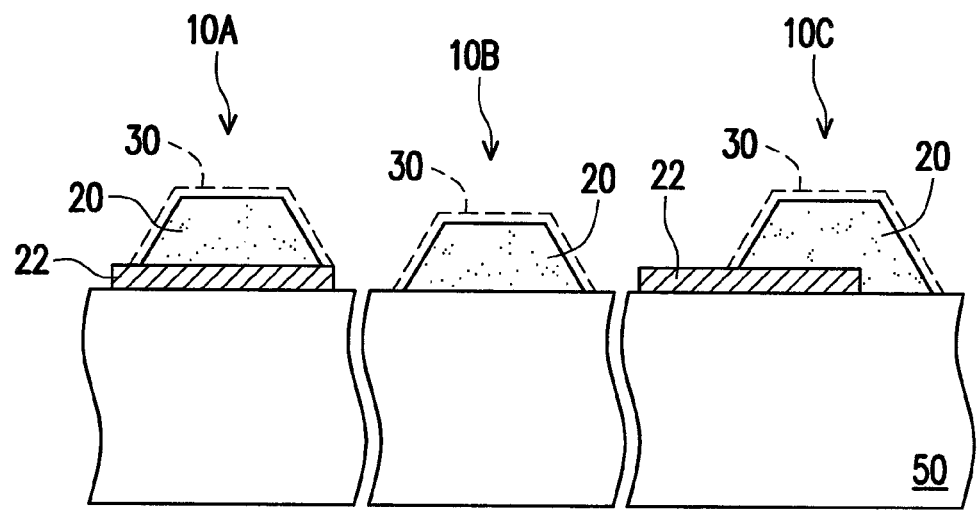
FIG. 3 is a schematic view showing the positions of a bonding inspection structure according to an exemplary embodiment.

FIG. 3 is a schematic view showing the positions of a bonding inspection structure according to an exemplary embodiment.

With reference to FIG. 3, the bonding inspection structure 10 in this embodiment is formed on the substrate 50. The substrate 50 can have an electrode 22 formed thereon. The bonding inspection structure 10 may be formed at any positions of the substrate. For example, a bonding inspection structure 10A is completely disposed on the electrode 22 of the substrate 50, which not only provides the function of inspection but also serves as a general flexible electrode for electrically conducting the electrode 22. A bonding inspection structure 10B is completely disposed on an area apart from the electrode 22, which is used for inspection only. A bonding inspection structure 10C is disposed partially on the electrode 22 and partially apart from the electrode 22, which is also used for inspection and serves as a general flexible electrode for electrically conducting the electrode 22. A material of the electrode 22 is a metal or an alloy.

Figure 4A:
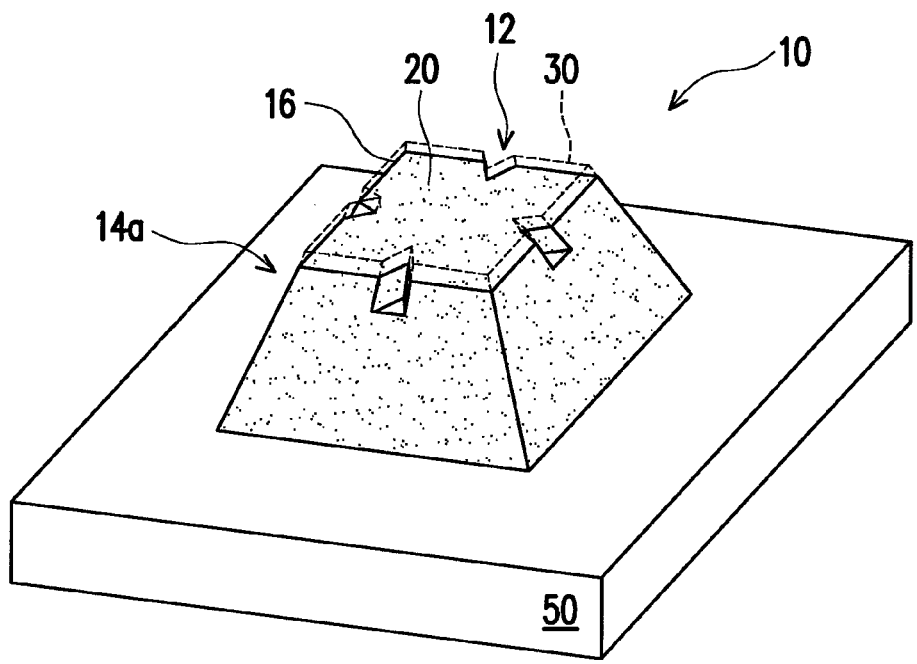
FIG. 4A is a schematic perspective view of a bonding inspection structure having a conductive layer which covers a top portion thereof and has notches at an edge of the top portion thereof according to an exemplary embodiment.
Figure 4B:
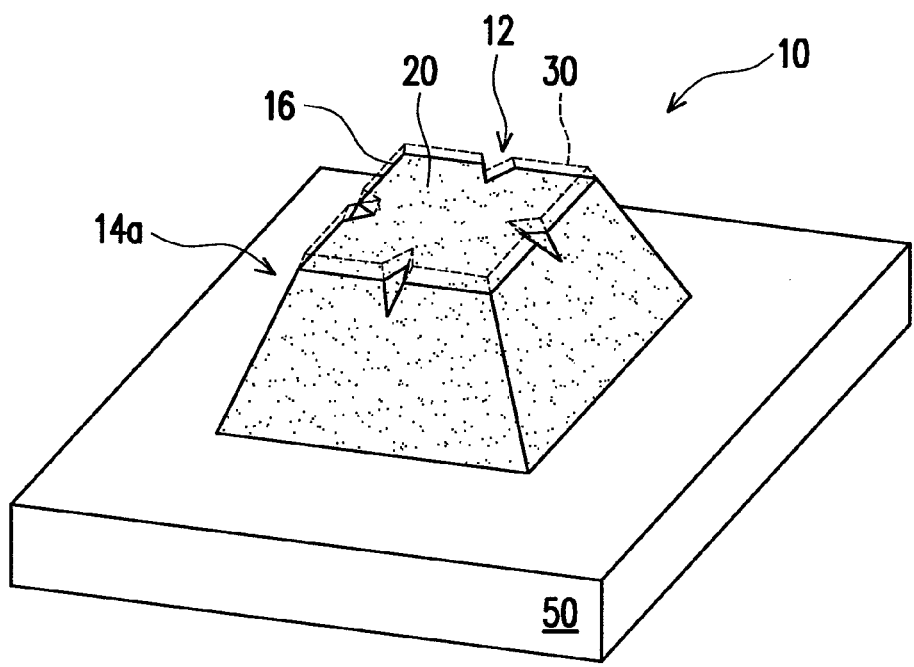
FIG. 4B is a schematic perspective view of another bonding inspection structure having a conductive layer which covers a top portion thereof and has notches at an edge of the top portion thereof according to an exemplary embodiment.

The bonding inspection structure 10 can be completely formed by the elastic bump 20, or can comprise the elastic bump 20 and the conductive layer 30. In FIGS. 1A~1F, 2A, 2B, and 3, the conductive layer 30 is conformal and completely covers the elastic bump 20. In another embodiment, the conductive layer 30 merely covers the top portion 14a of the elastic bump 20 shown in FIGS. 1A~1F, 2A, 2B, and 3. For simplicity, the perspective view in FIG. 4A is taken as an example for explanations. Referring to FIGS. 4A and 4B, the conductive layer 30 covers the top portion 14a of the elastic bump 20. The edges of the conductive layer 30 and the top portion 14a of the elastic bump 20 both have the notches 12, which are arranged in the same position.

A method for fabricating the bonding inspection structures in FIGS. 4A and 4B is, for example, to apply a polymer to form the elastic bump onto the substrate. Then, the photolithography process is used to pattern the polymer, so as to form the elastic bump partially on the electrode or on an area outside the electrode in the integrated circuit. Thereafter, a metal is disposed on the whole substrate, and photolithography and etching processes are used to pattern the metal layer and the polymer layer, so as to form a metal pattern and the elastic bump.

Figure 4C:
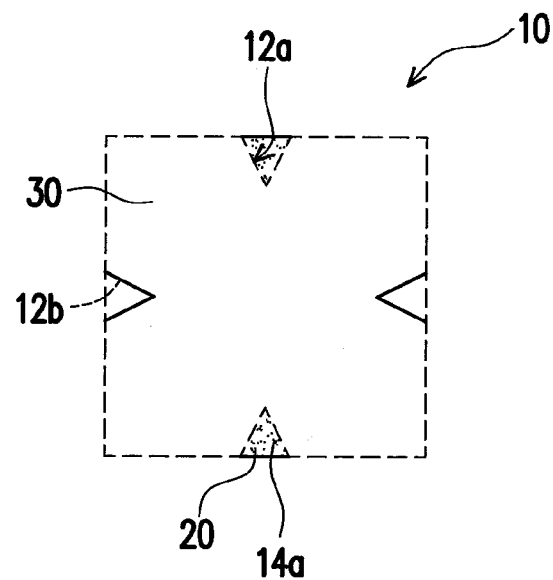
FIG. 4C is a schematic top view of yet another bonding inspection structure having a conductive layer which covers a top portion thereof and has notches at an edge of the top portion thereof according to an exemplary embodiment.
Figure 4D:
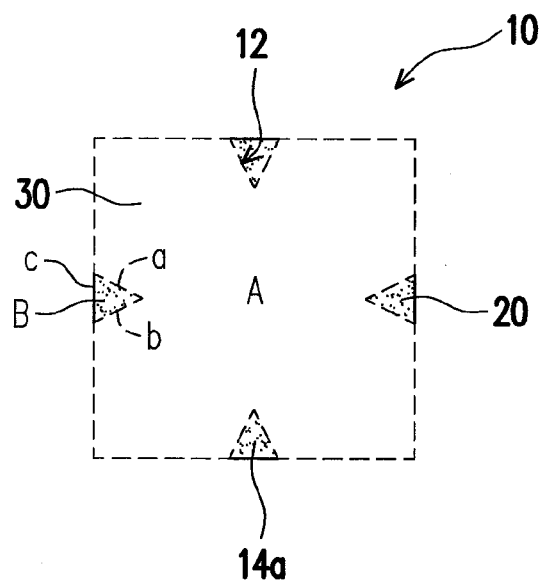
FIG. 4D is a schematic top view of yet another bonding inspection structure having a conductive layer which covers a top portion thereof and has notches at an edge of the top portion thereof according to an exemplary embodiment.

In other embodiments, the conductive layer 30 partially covers the top portion 14a of the elastic bump 20 and exposes the top portion 14a, as shown in FIGS. 4C and 4D. Referring to FIG. 4C, the conductive layer 30 covers the top portion 14a of the elastic bump 20. The edge of the conductive layer 30 has a notch 12a, and the edge of the top portion 14a has a notch 12b, wherein the notch 12a and the notch 12b are in different positions. For instance, the notches 12a and 12b are staggered, such that the notch 12a of the conductive layer 30 exposes the top portion 14a below and the conductive layer 30 covers the notch 12b of the top portion 14a. Referring to FIG. 4D, the conductive layer 30 covers the top portion 14a of the elastic bump 20. The edge of the top portion 14a of the elastic bump 20 has no notch, and the edge of the conductive layer 30 has the notch 12, which exposes the top portion 14a below.

The methods for forming the bonding inspection structures in FIGS. 4C and 4D are similar to the methods described in the embodiments of FIG. 1A, 1B, or 1C, but further comprise changing a pattern of a photomask when patterning the metal layer, so as to make the metal layer cover the top portion of the elastic bump only and form notches in the metal layer.

Figure 5A:
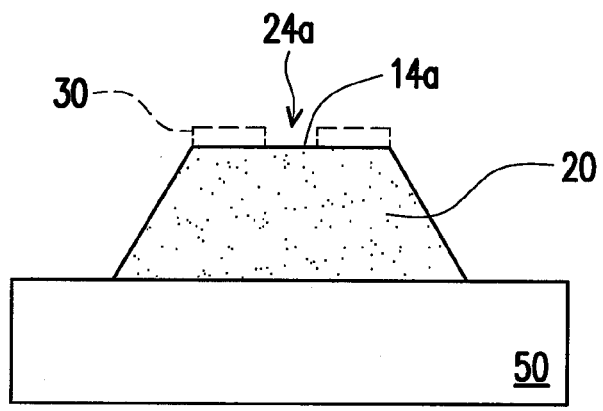
FIG. 5A is a schematic cross-sectional view of a bonding inspection structure having a conductive layer which has a hole and covers a top portion thereof according to an exemplary embodiment.
Figure 5B:
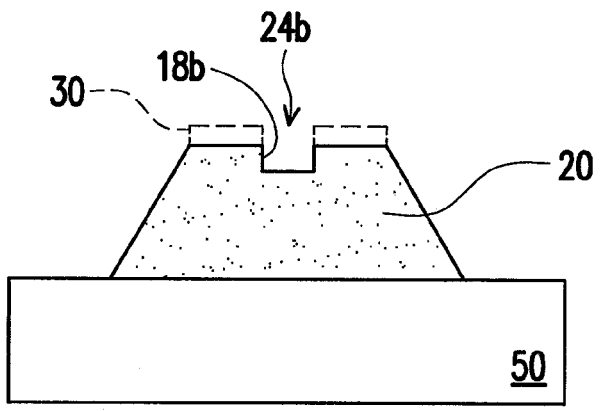
FIG. 5B is a schematic cross-sectional view of another bonding inspection structure having a conductive layer which has a blind hole and covers a top portion thereof according to an exemplary embodiment.
Figure 5C:
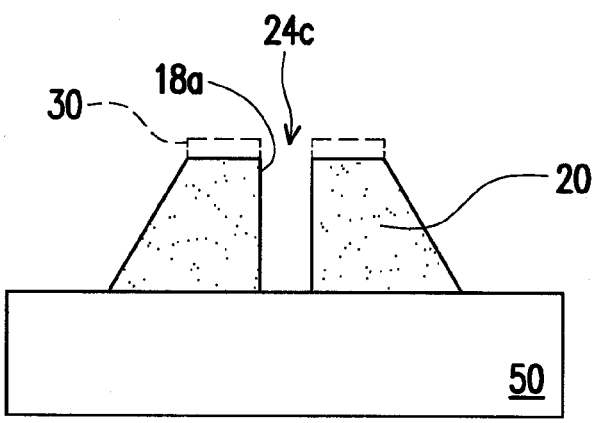
FIG. 5C is a schematic cross-sectional view of yet another bonding inspection structure having a conductive layer which has a through hole and covers a top portion thereof according to an exemplary embodiment.

With reference to FIGS. 5A, 5B, and 5C, the bonding inspection structure 10 includes the elastic bump 20 and the conductive layer 30, wherein the conductive layer 30 further has holes 24a, 24b, or 24c. In one embodiment, as shown in FIG. 5A, the elastic bump 20 below the hole 24a of the conductive layer 30 does not has any hole, and the hole 24a exposes the top of the elastic bump 20. In another embodiment, as shown in FIG. 5B, the elastic bump 20 below the hole 24b of the conductive layer 30 has a blind hole 18b, and the blind hole 18b is aligned with the hole 24b. In yet another embodiment, as shown in FIG. 5C, the elastic bump 20 below the hole 24c of the conductive layer 30 has a through hole 18a, and the through hole 18a is aligned with the hole 24c.

The methods for forming the bonding inspection structures in FIGS. 5A, 5B, and 5C are similar to the methods described in the embodiments of FIG. 4B or 4C, but further comprise forming the through hole or the blind hole in the polymer layer when patterning the polymer layer. Thereafter, the aforesaid steps are performed to form a patterned metal layer.

Figure 6A:
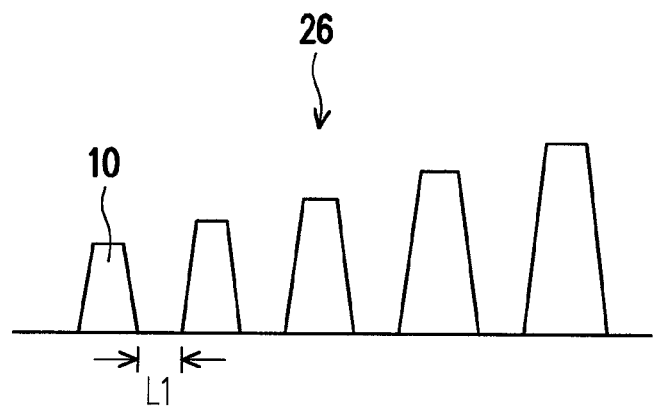
FIG. 6A is a schematic cross-sectional view of a set of bonding inspection structures arranged as stairs according to an exemplary embodiment.
Figure 6B:
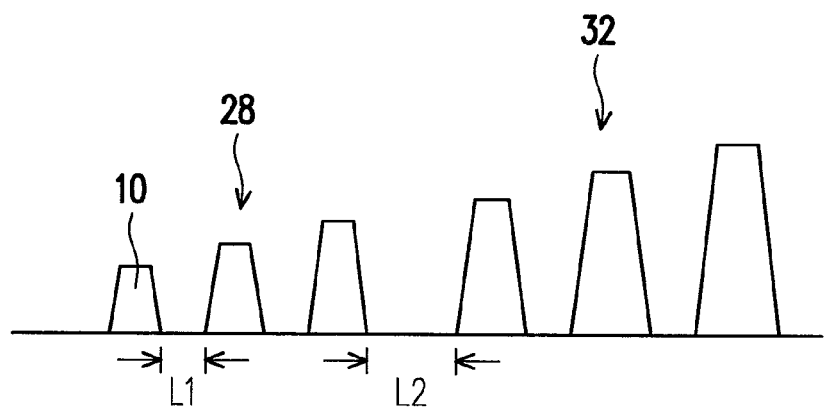
FIG. 6B is a schematic cross-sectional view of multiple sets of bonding inspection structures arranged as stairs according to an exemplary embodiment.

When being applied in practice, the inspection may be carried out by using one single bump structure having a height similar to the heights of other non-inspection bumps, or using a plurality of bonding inspection structures that have different heights and are arranged from low to high or from high to low, as stairs. FIG. 6A is a schematic cross-sectional view of a set of bonding inspection structures arranged as stairs according to an exemplary embodiment. FIG. 6B is a schematic cross-sectional view of multiple sets of bonding inspection structures arranged as stairs according to an exemplary embodiment.

Referring to FIGS. 6A and 6B, a plurality of bonding inspection structures 10 which are arranged as stairs may constitute a single set 26 in FIG. 6A or multiple sets, such as sets 28 and 32 in FIG. 6B. In the aforesaid sets 26, 28, or 32, the bonding inspection structures 10 are separated by a plurality of gaps L1, which are approximately equal. Different sets, such as the sets 28 and 32, are separated by a gap L2 which is larger than the gap L1 located between two neighboring bonding inspection structures 10 in one set.

Because the cracking of the bumps are relative to the pressure applied thereon and the heights thereof, the stair-like bumps of different heights help to judge different pressures and observe the height differences between gaps.

A method for fabricating the bonding inspection structures in FIGS. 6A and 6B is, for example, to apply a polymer which forms the elastic bumps onto the substrate and then use a gray-scale photomask to perform photolithography process to pattern the polymer. Thereby, elastic bumps of different heights are completed.

Figure 6C:
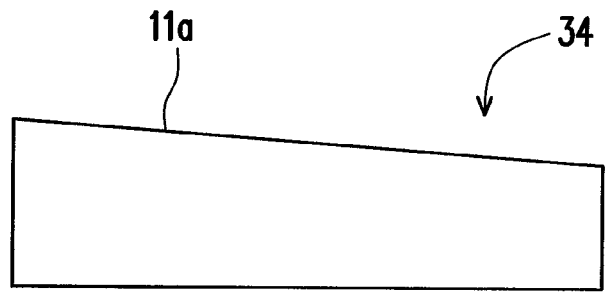
FIG. 6C is a schematic cross-sectional view of a column-like bonding inspection structure having an oblique plane top portion according to an exemplary embodiment.
Figures 1, 6C:
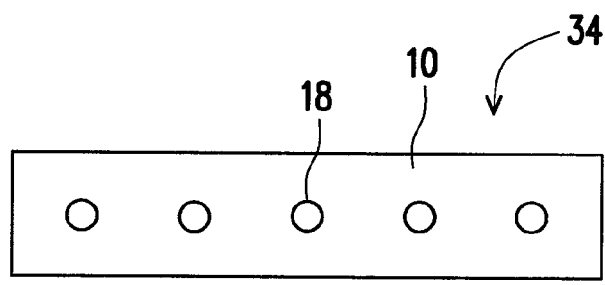
Figures 2, 6C:
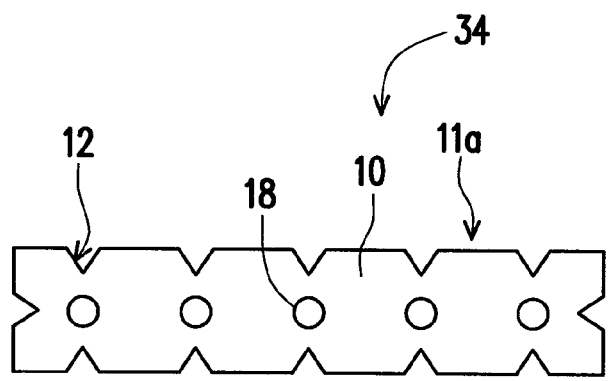

In another exemplary embodiment, a bonding inspection structure 34 is a combination of the stair-like bonding inspection structures 10 which have different heights, as shown in FIG. 6A. A cross-sectional view thereof is illustrated in FIG. 6C, and the top views thereof are shown in FIG. 6C-1 or 6C-2. To be more specific, referring to FIG. 6C, a height of the bonding inspection structure 34 is gradually increased to make a top portion 11a thereof an oblique plane. Further, a plurality of holes 18 are formed in a center of the top portion of the bonding inspection structure 34, as shown in FIG. 6C-1. Besides the holes 18, the edges of the top portion 11a of the bonding inspection structure 34 may further have a plurality of notches 12 formed thereon. When compressed by different pressures, because the height of the bonding inspection structure 34 is increased gradually, the location and degree of cracking are easily observed to inspect the compression condition and the height difference of the gap between the two substrates.

In summary, the bonding inspection structure includes at least one elastic bump and optionally includes at least one conductive layer. The conductive layer at least covers a portion of the top portion of the elastic bump. The elastic bump or the conductive layer at least has one opening therein. The opening may be a notch, a hole, or a combination thereof. The notch may be formed at the edge of the top portion of the elastic bump, at the edge of the conductive layer, or at the edge of the top portion of the elastic bump and the edge of the conductive layer simultaneously. The hole may be formed in the center of the top portion of the conductive layer, in the center of the top portion of the elastic bump, or in the center of the top portion of the conductive layer and the center of top portion of the elastic bump simultaneously. The aforesaid "center" does not need to be the exact center of the top portion of the conductive layer or the elastic bump, and may be any area other than the edge. Moreover, the present invention does not specifically limit the numbers of the notches or holes. For easy observation of the cracks occurring during compression, the inspection area is made larger than the area of the opening. For example, the inspection area is larger than the opening by ¼. In one of the embodiments, the bonding inspection structure is an elastic bump having no conductive layer thereon, wherein the inspection area is the area outside the opening on the top portion of the elastic bump; and the area of the opening is a sum of the areas occupied by the notches on the top portion of the elastic bump and the hole in the center of the top portion of the elastic bump. In another embodiment, the bonding inspection structure includes the elastic bump and the conductive layer thereon, wherein the inspection area is the area outside the opening formed on the top portion of the conductive layer; and the area of the opening is a sum of the areas occupied by the notches on the top portion of the conductive layer and the hole in the center of the top portion of the conductive layer. Take FIG. 4D as an example for explanations, the bonding inspection structure 10 includes the elastic bump 20 and the conductive layer 30. The conductive layer 30 covers the top portion 14a of the elastic bump 20 and has the notches 12 formed at the edge thereof, which expose the top portion 14a of the elastic bump 20 below. Accordingly, the inspection area is an area A, which is outside the notches 12 on the top portion 14a; and the area of the opening is a sum of areas B which are surrounded by the top portion contour segment c of the conductive layer 30 and two side segments a and b of the notches 12.

Because of the openings, the bonding inspection structure only requires a low compression pressure to generate obvious cracks. Moreover, the total area of the openings is smaller than the inspection area on the elastic bump or the conductive layer, and thus the inspection area is large enough for observing the cracking and bonding.

FIGS. 7A~7D are schematic cross-sectional views showing various bonding structures according to an exemplary embodiment.

Figure 7A:
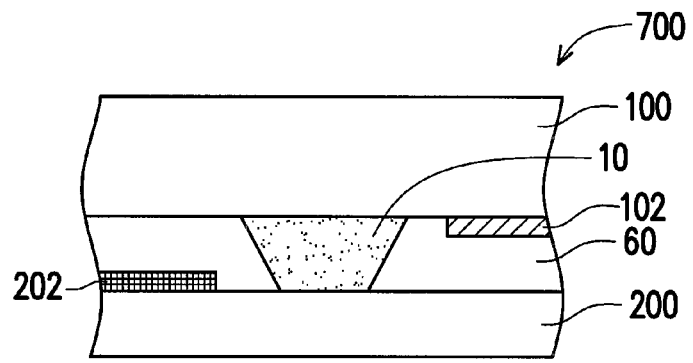
FIGS. 7A~7D are schematic cross-sectional views showing various bonding structures according to an exemplary embodiment.

Referring to FIG. 7A, a bonding structure 700 includes substrates 100 and 200, the bonding inspection structure 10, and a bonding material 60. The bonding inspection structure 10 may be any of the bonding inspection structures described in the above embodiments, and additionally can be the single set 26 or the multiple sets 28 and 32. Further, the bonding inspection structure 10 is disposed between the substrates 100 and 200. The bonding material 60 is used for interconnecting and sealing the substrates 100 and 200. The bonding inspection structure 10 is located between the substrates 100 and 200 without contacting the electrodes 102 and 202 on the substrates 100 and 200, respectively. Hence, the bonding inspection structure 10 is used for inspecting the bonding only.

Figure 7B:
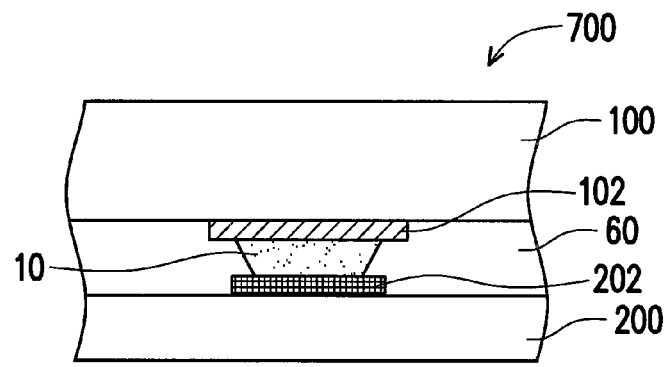

Referring to FIG. 7B, the two substrates 100 and 200 are sealed by the bonding material 60, and the bonding inspection structure 10 is disposed between an electrode 102 of the substrate 100 and an electrode 202 of the substrate 200 without reaching the substrates 100 or 200. The bonding inspection structure 10 contacts the electrode 102 on the substrate 100 and the electrode 202 on the substrate 200. Therefore, the bonding inspection structure 10 is not only used for inspection but also serves as a general flexible electrode which electrically conducts the electrodes 102 and 202.

Figure 7C:
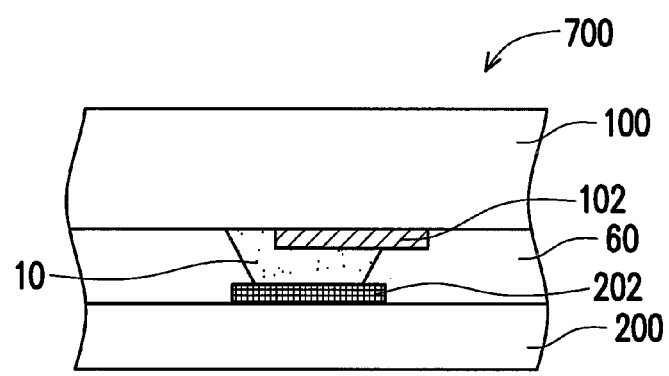

As shown in FIG. 7C, the two substrates 100 and 200 are sealed by the bonding material 60. The bonding inspection structure 10 is positioned between the electrode 102 of the substrate 100 and the electrode 202 of the substrate 200, and extends to cover a surface of the substrate 100. Likewise, a portion of the bonding inspection structure 10 is in contact with the electrode 202 of substrate 200 and the other portion thereof is disposed on the area outside the electrode 102 of substrate 100. Therefore, the bonding inspection structure 10 is not only used for inspection but also serves as a general flexible electrode for electrically conducting the electrodes 102 and 202.

Figure 7D:
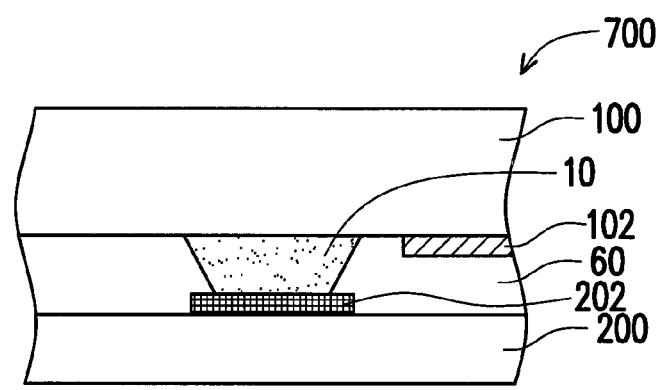

As shown in FIG. 7D, the two substrates 100 and 200 are sealed by the bonding material 60. The bonding inspection structure 10 is disposed between the substrates 100 and 200. The bonding material 60 is used for interconnecting and sealing the substrates 100 and 200. The bonding inspection structure 10 is positioned between the substrate 100 and the substrate 200. The bonding inspection structure 10 is located on the substrates 100 without contacting the electrodes 102 and is in contact with the electrode 202 of substrate 200.

The aforesaid substrates 100 and 200 may be a rigid substrate, a soft substrate, or a flexible substrate, such as glass, an acrylic plate, or a circuit board. A material of the electrodes 102 and 202 is a metal or an alloy.

The bonding inspection structure of the exemplary embodiment is designed to have stress concentration notches or holes in the conductive layer. Hence, cracks are formed under a low pressure to facilitate observation and increase recognition ratio. Moreover, the inspection area of the bonding inspection structure is larger than the total area of the notches or the holes. After being compressed, the bonding inspection structure is not required to be connected with a glass substrate for testing and observation. Furthermore, the cracking thereof can be directly observed by optical microscopy without using any scanning electron microscopy (SEM) to make inspection on physical properties, such as the height difference of the gap between the compressed substrates. Therefore, the time for SEM analyses is omitted and reliable compression data can be quickly obtained, thus suitable for being used in mass production. Based on the above, those embodiments have the merits of instantly improving the fabricating process, simplifying the complexity of inspection, and reducing production costs and time. The compression degree of the bump structures may also be relied on to examine electrical conductivity. In addition, the present invention may also be combined with an IC having metal bumps.

Although the present invention has been disclosed by the above embodiments, they are not intended to limit the present invention. Persons having ordinary knowledge in the art may make some modifications and variations without departing from the spirit and scope of the present invention. Therefore, the protection sought by the present invention falls in the appended claims.

What is claimed is:

1. A bonding inspection structure, disposed on a substrate, comprising:
   at least an elastic bump disposed on the substrate, wherein the elastic bump has a plurality of sidewalls,
   wherein the elastic bump has a plurality of separate first notches;
   wherein the first notches are formed respectively at the sidewalls of the elastic bump, and extend to and flush with the sidewalls of the elastic bump and the inspection area is the area of the top surface of the elastic bump outside the first notches.

2. The bonding inspection structure as claimed in claim 1, wherein the elastic bump further comprises a first hole formed in a center of the top surface of the elastic bump.

3. The bonding inspection structure as claimed in claim 1, wherein the first notches extend to a middle portion or a bottom portion on the sidewall of the elastic bump.

4. The bonding inspection structure as claimed in claim 2, wherein the first hole is a blind hole or a through hole.

5. The bonding inspection structure as claimed in claim 2, wherein, at the top surface of the elastic bump, an opening width of each first notches is decreased from an edge of the elastic bump inwardly to a center of the top surface of the elastic bump.

6. The bonding inspection structure as claimed in claim 1, further comprising at least a conductive layer which at least covering the top surface of the elastic bump, wherein the conductive layer has a plurality of separate second notches formed respectively at sidewalls of the conductive layer, and an inspection area of the top portion of the conductive layer is larger than an area of the second notches.

7. The bonding inspection structure as claimed in claim 6, wherein, at the top surface of the conductive layer, an opening width of each second notches is decreased from an edge of the conductive layer inwardly to a center of the top surface of the conductive layer.

8. The bonding inspection structure as claimed in claim 6, wherein the second notches extend to a middle portion or a bottom portion on the sidewall of the bonding inspection structure.

9. The bonding inspection structure as claimed in claim 7, wherein the first notches and the second notches are staggered or aligned with each other.

10. The bonding inspection structure as claimed in claim 7, wherein the conductive layer comprises at least a second hole and the second hole is a blind hole or a through hole.

11. The bonding inspection structure as claimed in claim 10, wherein the first hole and the second hole are staggered or aligned with each other.

12. The bonding inspection structure as claimed in claim 1, wherein the elastic bump is shaped like a cone, a pyramid or a column.

13. The bonding inspection structure as claimed in claim 1, wherein a projection of the top portion of the elastic bump is triangular, quadrilateral, polygonal, circular, or elliptic.

14. The bonding inspection structure as claimed in claim 1, wherein the top portion of the elastic bump has a surface of sharp teeth.

15. The bonding inspection structure as claimed in claim 1, wherein the top portion of the elastic bump is a horizontal plane.

16. The bonding inspection structure as claimed in claim 1, wherein the top portion of the elastic bump is an oblique plane to a surface of the substrate, and the elastic bump has a plurality of the first openings.

17. The bonding inspection structure as claimed in claim 6, wherein the top portion of the elastic bump is an oblique plane, and the elastic bump or the conductive layer has a plurality of the first openings.

18. The bonding inspection structure as claimed in claim 1, wherein a material of the elastic bump comprises an organic material, an inorganic material, or a composite material thereof.

19. The bonding inspection structure as claimed in claim 1, wherein the elastic bump is disposed on at least an electrode of the substrate.

20. The bonding inspection structure as claimed in claim 1, wherein the elastic bump is disposed on an area apart from the electrode on the substrate.

21. The bonding inspection structure as claimed in claim 1, wherein a portion of the elastic bump is disposed on an electrode of the substrate; and another portion of the elastic bump is disposed on an area apart from the electrode on the substrate.

22. The bonding inspection structure as claimed in claim 1, comprising a plurality of elastic bumps having different heights.

23. The bonding inspection structure as claimed in claim 22, wherein the elastic bumps are arranged as stairs.

24. The bonding inspection structure as claimed in claim 23, wherein the elastic bumps which are arranged as stairs constitute a single set or multiple sets.

25. The bonding inspection structure as claimed in claim 1, wherein the substrate is a rigid substrate, a soft substrate, or a flexible substrate.

26. A bonding structure, comprising:
a first substrate;
a second substrate;
a bonding inspection structure located between the first substrate and the second substrate, the bonding inspection structure comprising:
at least an elastic bump, wherein the elastic bump has a plurality of sidewalls,
wherein the elastic bump a plurality of separate first notches, and an inspection area of a top portion of the elastic bump is larger than an area of the first notches;
wherein the first notches are formed at the sidewalls of the elastic bump, and extend to and flush with the sidewalls of the elastic bump, and the inspection area is the area of the top surface of the elastic bump outside the first notches; and
a bonding material disposed around the bonding inspection structure to seal the first and the second substrates.

27. The bonding structure as claimed in claim 26, wherein the first substrate further comprises a first electrode, and the bonding inspection structure is disposed on the first electrode.

28. The bonding structure as claimed in claim 27, wherein the second substrate further comprises a second electrode, and the bonding inspection structure is disposed on the second electrode.

29. The bonding structure as claimed in claim 26, wherein the first substrate further comprises a first electrode and a portion of the bonding inspection structure is disposed on the first electrode while another portion of the bonding inspection structure is disposed on the first substrate.

30. The bonding structure as claimed in claim 29, wherein the second substrate further comprises a second electrode, and the bonding inspection structure is disposed on the second electrode.

31. The bonding structure as claimed in claim 26, wherein the first substrate further comprises a first electrode, and the bonding inspection structure is not disposed on the first electrode.

32. The bonding structure as claimed in claim 31, wherein the second substrate further comprises a second electrode and the bonding inspection structure is disposed on the second electrode.

33. The bonding structure as claimed in claim 26, wherein the elastic bump further comprises a first hole formed in a center of the top surface of the elastic bump.

34. The bonding structure as claimed in claim 26, further comprising at least a conductive layer, wherein the conductive layer has a plurality of separate second notches at the sidewall of the conductive layer, and an inspection area of a top surface of the conductive layer is larger than an area of the second notches.

35. The bonding structure as claimed in claim 34, wherein at the top surface of the conductive layer, an opening width of each second notches is decreased from an edge of the conductive layer inwardly to a center of the top surface of the conductive layer.

* * * * *